(12) United States Patent
Radke et al.

(10) Patent No.: US 8,451,664 B2
(45) Date of Patent: May 28, 2013

(54) DETERMINING AND USING SOFT DATA IN MEMORY DEVICES AND SYSTEMS

(75) Inventors: William H. Radke, Los Gatos, CA (US); Zhenlei Shen, Boise, ID (US); Peter Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 499 days.

(21) Appl. No.: 12/778,577

(22) Filed: May 12, 2010

(65) Prior Publication Data
US 2011/0280084 A1  Nov. 17, 2011

(51) Int. Cl.
G11C 11/34 (2006.01)

(52) U.S. Cl.
USPC ............ 365/185.24; 365/185.21; 365/185.22; 365/185.23

(58) Field of Classification Search
USPC .............. 365/185.24, 185.21, 185.22, 185.23
See application file for complete search history.

(56) References Cited

U.S. PATENT DOCUMENTS

| | | | |
|---|---|---|---|
| 5,532,693 A | 7/1996 | Winters et al. |
| 5,555,540 A | 9/1996 | Radke |
| 5,734,926 A | 3/1998 | Feeley et al. |
| 5,751,699 A | 5/1998 | Radke |
| 6,646,646 B2 | 11/2003 | Peterson et al. |
| 6,734,865 B1 | 5/2004 | Peterson et al. |
| 6,741,253 B2 | 5/2004 | Radke et al. |
| 6,784,889 B1 | 8/2004 | Radke |
| 6,791,555 B1 | 9/2004 | Radke et al. |
| 6,816,165 B1 | 11/2004 | Radke |
| 6,856,529 B1 | 2/2005 | Radke |
| 6,956,577 B2 | 10/2005 | Radke et al. |
| 6,963,343 B1 | 11/2005 | Peterson et al. |
| 6,969,883 B2 | 11/2005 | Chindalore et al. |
| 7,038,946 B2 | 5/2006 | Hosono et al. |
| 7,139,182 B2 | 11/2006 | Radke |
| 7,180,522 B2 | 2/2007 | Radke et al. |
| 7,187,585 B2 | 3/2007 | Li et al. |
| 7,196,946 B2 | 3/2007 | Chen et al. |
| 7,257,025 B2 | 8/2007 | Maayan et al. |
| 7,257,032 B2 | 8/2007 | Fujiu et al. |
| 7,322,002 B2 | 1/2008 | Keays et al. |
| 7,369,434 B2 | 5/2008 | Radke |
| 7,379,068 B2 | 5/2008 | Radke |
| 7,389,465 B2 | 6/2008 | Radke et al. |
| 7,397,477 B2 | 7/2008 | Radke |
| 7,444,579 B2 | 10/2008 | Radke et al. |
| 7,453,723 B2 | 11/2008 | Radke |
| 7,512,909 B2 | 3/2009 | Radke |

(Continued)

OTHER PUBLICATIONS

International Search Report and Written Opinion for related PCT Application No. PCT/US2011/000761 (10 pgs.), Nov. 7, 2011.

*Primary Examiner* — Vu Le
*Assistant Examiner* — Han Yang
(74) *Attorney, Agent, or Firm* — Brooks, Cameron & Huebsch, PLLC (57) ABSTRACT

The present disclosure includes methods, devices, and systems for determining and using soft data in memory devices and systems. One or more embodiments include an array of memory cells and control circuitry coupled to the array. The control circuitry is configured to perform a number of sense operations on the memory cells using a number of sensing voltages to determine soft data associated with a target state of the memory cells, and adjust a sensing voltage used to determine the target state based, at least partially, on the determined soft data.

12 Claims, 5 Drawing Sheets

U.S. PATENT DOCUMENTS

| | | |
|---|---|---|
| 7,523,381 B2 | 4/2009 | Eggleston et al. |
| 2002/0070941 A1 | 6/2002 | Peterson et al. |
| 2003/0067472 A1 | 4/2003 | Radke et al. |
| 2004/0183808 A1 | 9/2004 | Radke et al. |
| 2005/0024367 A1 | 2/2005 | Radke |
| 2005/0030313 A1 | 2/2005 | Radke et al. |
| 2005/0052889 A1 | 3/2005 | Radke |
| 2005/0128208 A1 | 6/2005 | Radke |
| 2005/0169030 A1 | 8/2005 | Radke |
| 2005/0172207 A1 | 8/2005 | Radke et al. |
| 2005/0268203 A1 | 12/2005 | Keays et al. |
| 2006/0203529 A1 | 9/2006 | Radke |
| 2006/0248434 A1 | 11/2006 | Radke et al. |
| 2007/0091677 A1 | 4/2007 | Lasser et al. |
| 2007/0162824 A1 | 7/2007 | Radke et al. |
| 2007/0206434 A1 | 9/2007 | Radke |
| 2007/0226592 A1 | 9/2007 | Radke |
| 2008/0037320 A1 | 2/2008 | Radke |
| 2008/0056027 A1 | 3/2008 | Radke |
| 2008/0072120 A1 | 3/2008 | Radke |
| 2008/0092017 A1 | 4/2008 | Keays et al. |
| 2008/0175055 A1 | 7/2008 | Kim |
| 2008/0184094 A1 | 7/2008 | Murray et al. |
| 2008/0215930 A1 | 9/2008 | Radke |
| 2008/0218525 A1 | 9/2008 | Radke |
| 2008/0266306 A1 | 10/2008 | Radke |
| 2008/0310234 A1 | 12/2008 | Lee et al. |
| 2009/0003058 A1 | 1/2009 | Kang |
| 2009/0013233 A1 | 1/2009 | Radke |
| 2009/0013234 A1 | 1/2009 | Radke |
| 2009/0019321 A1 | 1/2009 | Radke |
| 2009/0019340 A1 | 1/2009 | Radke et al. |
| 2009/0055697 A1 | 2/2009 | Radke et al. |
| 2009/0067249 A1 | 3/2009 | Radke |
| 2009/0103380 A1 | 4/2009 | Pekny et al. |
| 2009/0109747 A1 | 4/2009 | Radke |
| 2009/0129169 A1 | 5/2009 | Roohparvar et al. |
| 2009/0132755 A1 | 5/2009 | Radke |
| 2009/0132889 A1 | 5/2009 | Radke |
| 2009/0198880 A1 | 8/2009 | Radke |
| 2009/0248952 A1 | 10/2009 | Radke et al. |
| 2009/0300269 A1 | 12/2009 | Radke et al. |
| 2010/0020611 A1 | 1/2010 | Park |
| 2010/0165738 A1* | 7/2010 | Cernea ............... 365/185.19 |
| 2010/0165743 A1* | 7/2010 | Cernea ............... 365/185.21 |
| 2012/0262991 A1* | 10/2012 | Ghilardelli ......... 365/185.18 |

* cited by examiner

DETERMINING AND USING SOFT DATA IN MEMORY DEVICES AND SYSTEMS

TECHNICAL FIELD

The present disclosure relates generally to semiconductor memory devices, methods, and systems, and more particularly, to methods, devices, and systems for determining and using soft data in memory devices and systems.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among others.

Flash memory devices can be utilized as volatile and non-volatile memory for a wide range of electronic applications. Flash memory devices typically use a one-transistor memory cell that allows for high memory densities, high reliability, and low power consumption. Uses for flash memory include memory for solid state drives (SSDs), personal computers, personal digital assistants (PDAs), digital cameras, cellular telephones, portable music players, e.g., MP3 players, and movie players, among other electronic devices. Data, such as program code, user data, and/or system data, such as a basic input/output system (BIOS), are typically stored in flash memory devices.

Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to (and in some cases form) an access line, which is commonly referred to in the art as a "word line". However each memory cell is not directly coupled to a data line (which is commonly referred to as a digit line, e.g., a bit line, in the art) by its drain. Instead, the memory cells of the array are coupled together in series, source to drain, between a common source and a data line, where the memory cells commonly coupled to a particular data line are referred to as a "column".

Memory cells in a NAND array architecture can be programmed to a target, e.g., desired, state. For example, electric charge can be placed on or removed from a charge storage node of a memory cell to put the cell into one of a number of programmed states. For example, a single level cell (SLC) can represent two states, e.g., 1 or 0. Flash memory cells can also store more than two states, e.g., 1111, 0111, 0011, 1011, 1001, 0001, 0101, 1101, 1100, 0100, 0000, 1000, 1010, 0010, 0110, and 1110. Such cells can be referred to as multilevel cells (MLCs). MLCs can allow the manufacture of higher density memories without increasing the number of memory cells since each cell can represent more than one digit, e.g., more than one bit. For example, a cell capable of representing four digits can have sixteen programmed states.

Sensing operations, e.g., read and/or program verify operations, use sensing voltages to determine the state of flash memory cells. However, a number of mechanisms, such as read disturb, program disturb, and/or charge loss, e.g., charge leakage, can cause the stored charge on the charge storage node, e.g., the threshold voltage (Vt), of the memory cells, to change. As a result of the change in the stored charge, previously used sensing voltages, e.g., sensing voltages used during sensing operations performed before the change in the stored charge occurs, may no longer provide accurate and/or reliable sensing of the memory cells. That is, previously used sensing voltages may result in an erroneous sensing of the memory cells when used during sensing operations performed after the change in the stored charge occurs. For example, the use of previous sensing voltages may result in a determination that the memory cells are in a state other than the target state, e.g., a state different than the state to which the cell was programmed.

DETAILED DESCRIPTION

The present disclosure includes methods, devices, and systems for determining and using soft data in memory devices and systems. One or more embodiments include an array of memory cells and control circuitry coupled to the array. The control circuitry is configured to perform a number of sense operations on the memory cells using a number of sensing voltages to determine soft data associated with a target state of the memory cells, and adjust a sensing voltage used to determine the target state based, at least partially, on the determined soft data.

Soft data associated with a memory cell can indicate a location of a threshold voltage (Vt) of the memory cell within a Vt distribution representing the target state to which the memory cell was programmed, as will be further described herein. Additionally, soft data associated with a memory cell can indicate a probability of whether the Vt of the memory cell corresponds to the target state to which the memory cell was programmed, as will be further described herein. In contrast, data that corresponds to the state a memory cells is determined to be in by a sensing operation can be referred to as hard data, as will be further described herein.

Embodiments of the present disclosure can be used to track and/or compensate for Vt change, e.g., shift, in memory devices and/or systems. Tracking and/or compensating for Vt changes can provide benefits such as increased accuracy and/or reliability, e.g., decreased error rate, and/or increased memory device and/or system life, among other benefits.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory devices can refer to one or more memory devices. Additionally, the designators "N" and "M" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 500 in FIG. 5. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

Figure 1:
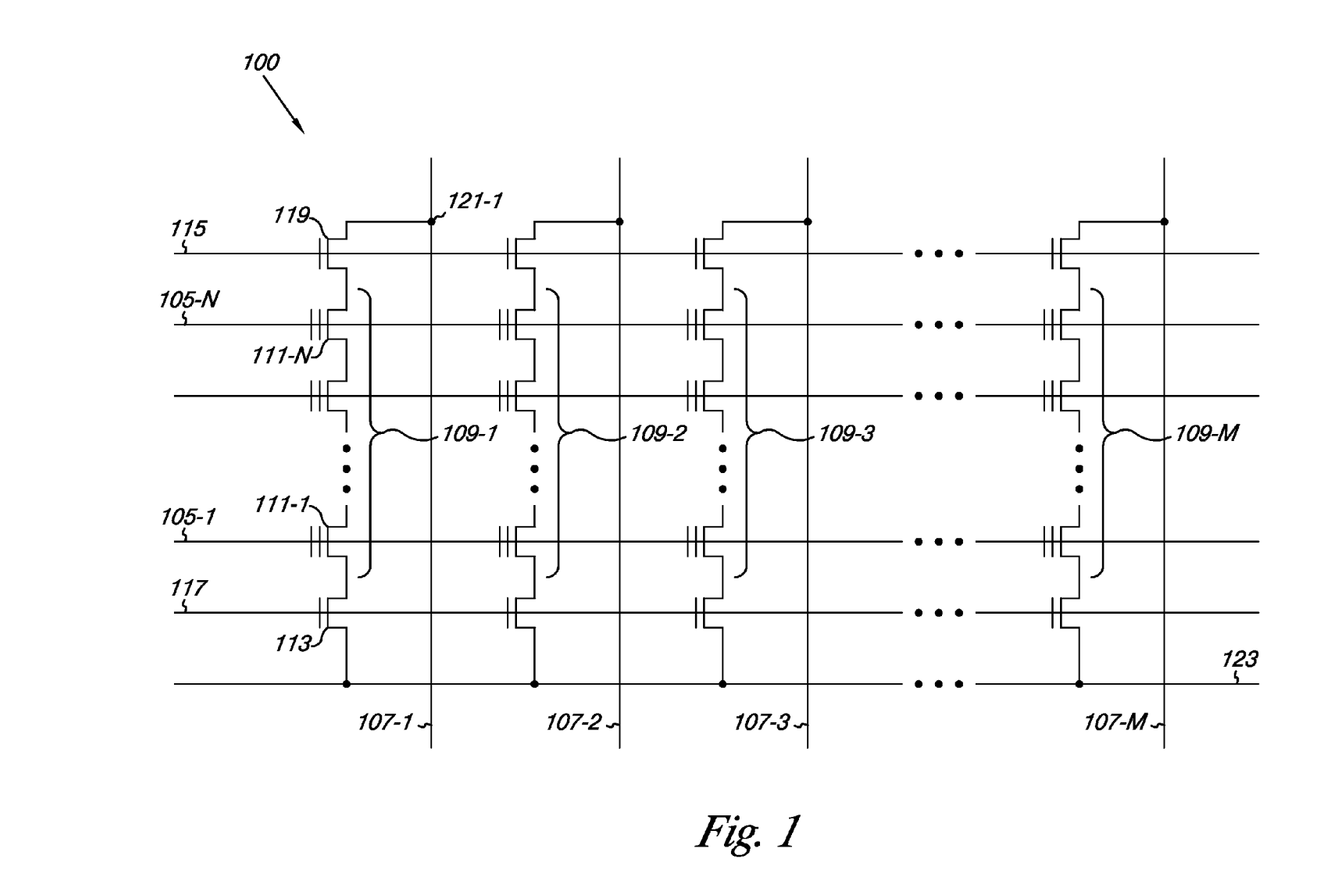
FIG. 1 is a schematic of a portion of a non-volatile memory array in accordance with one or more embodiments of the present disclosure.

FIG. 1 is a schematic of a portion of a non-volatile memory array 100 in accordance with one or more embodiments of the present disclosure. The embodiment of FIG. 1 illustrates a NAND architecture non-volatile memory array. However, embodiments described herein are not limited to this example. As shown in FIG. 1, the memory array 100 includes access lines, e.g., word lines 105-1, . . . , 105-N and intersecting data lines, e.g., local bit lines 107-1, 107-2, 107-3, . . . , 107-M. For ease of addressing in the digital environment, the number of word lines 105-1, . . . , 105-N and the number of local bit lines 107-1, 107-2, 107-3, . . . , 107-M can be some power of two, e.g., 256 word lines by 4,096 bit lines.

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The non-volatile memory cells 111-N of each NAND string 109-1, 109-2, 109-3, . . . , 109-M are connected in series source to drain between a source select gate (SGS), e.g., a field-effect transistor (HT) 113, and a drain select gate (SGD), e.g., FET 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N, e.g., a floating-gate transistor, of the corresponding NAND string 109-1.

In one or more embodiments, construction of the non-volatile memory cells 111-1, . . . , 111-N includes a source, a drain, a floating gate or other charge storage node, and a control gate. The non-volatile memory cells 111-1, . . . , 111-N have their control gates coupled to a word line, 105-1, . . . , 105-N respectively. A "column" of the non-volatile memory cells, 111-1, . . . , 111-N, make up the NAND strings 109-1, 109-2, 1109-3, . . . , 109-M, and are coupled to a given local bit line 107-1, 107-2, 107-3, . . . , 107-M, respectively. A "row" of the non-volatile memory cells are those memory cells commonly coupled to a given word line 105-1, . . . , 105-N. The use of the terms "column" and "row" is not meant to imply a particular linear, e.g., vertical and/or horizontal, orientation of the non-volatile memory cells. A NOR array architecture would be similarly laid out, except that the string of memory cells would be coupled in parallel between the select gates.

As one of ordinary skill in the art will appreciate, subsets of cells coupled to a selected word line, e.g., 105-1, . . . , 105-N, can be programmed and/or sensed, e.g., read, together as a group. A programming operation, e.g., a write operation, can include applying a number of program pulses, e.g., 16V-20V, to a selected word line in order to increase the threshold voltage (Vt) of selected cells coupled to that selected access line to a desired program voltage level corresponding to a target, e.g., desired, program state.

A sensing operation, such as a read or program verify operation, can include sensing a voltage and/or current change of a bit line coupled to a selected cell in order to determine the state of the selected cell. The sensing operation can involve providing a voltage to, e.g., biasing, a bit line, e.g., bit line 107-1, associated with a selected memory cell above a voltage, e.g., bias voltage, provided to a source line, e.g., source line 123, associated with the selected memory cell. A sensing operation could alternatively include pre-charging the bit line 107-1 followed with discharge when a selected cell begins to conduct, and sensing the discharge.

Sensing the state of a selected cell can include providing a number of sensing voltages, e.g., read voltages, to a selected word line while providing a number of voltages, e.g., read pass voltages, to the word lines coupled to the unselected cells of the string sufficient to place the unselected cells in a conducting state independent of the threshold voltage of the unselected cells. The bit line corresponding to the selected cell being read and/or verified can be sensed to determine whether or not the selected cell conducts in response to the particular sensing voltage applied to the selected word line. For example, the state of a selected cell can be determined by the word line voltage at which the bit line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the state of the selected cell can be determined based on the current and/or voltage sensed on the bit line corresponding to the string. For instance, the state of the selected cell can be determined based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string, the diffused regions between cell stacks, and the select transistors.

Figure 2:
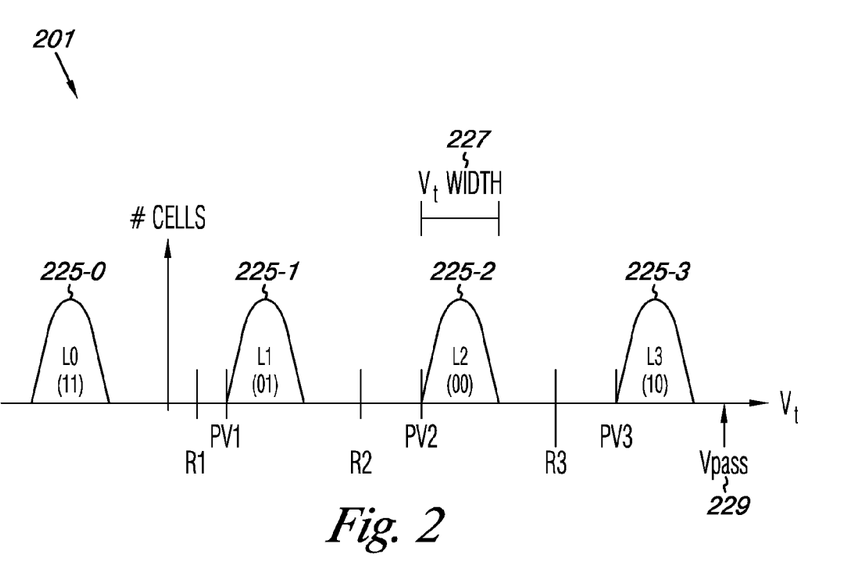
FIG. 2 illustrates a diagram of a number of threshold voltage distributions and sensing voltages in accordance with one or more embodiments of the present disclosure.

FIG. 2 illustrates a diagram 201 of a number of threshold voltage distributions and sensing voltages in accordance with one or more embodiments of the present disclosure. The example shown in FIG. 2 can represent, for example, memory cells 111-1, . . . , 111-N previously described in connection with FIG. 1. The example shown in FIG. 2 represents two-bit, e.g., four-state, memory cells. However, embodiments of the present disclosure are not limited to this example of two-bit memory cells, as will be appreciated by one of ordinary skill in the art.

As shown in FIG. 2, threshold voltage (Vt) distributions 225-0, 225-1, 225-2, and 225-3 represent four target states, e.g., L0, L1, L2, and L3, respectively, to which the memory cells can be programmed. In the example illustrated in FIG. 2, Vt distribution 225-3 can be referred to as a maximum Vt, e.g., "$Vt_{max}$", to which a cell can be programmed because it is the range including the Vt with the largest magnitude. In operation, the memory cells in a selected block can be erased together such that they have a Vt level within Vt distribution 225-0 prior to being programmed. As such, distribution 225-0 can be referred to as an erased state and can represent a particular stored data state (target state L0), e.g., stored data such as binary "11". Target state L1 can correspond to data 01, target state L2 can correspond to data 00, and target state L3 can correspond to data 10.

Vt distributions 225-0, 225-1, 225-2, and 225-3 can represent a number of memory cells that are programmed to the corresponding target states, where the height of a Vt distribution curve indicates a number of cells programmed to a particular voltage within the Vt distribution, on average. The width 227 of the Vt distribution curve indicates the range of voltages that represent a particular target state, e.g., the width of the Vt distribution curve 225-2 for L2 represents the range of voltages that correspond to data 00.

A number of sensing voltages are illustrated in FIG. 2. Such sensing voltages can include program verify voltages and/or read voltages, among other sensing voltages. For example, program verify voltages PV1, PV2, and PV3 are illustrated, as well as read voltages R1, R2, and R3. A program verify operation can be performed after one or more programming pulses to help determine whether a memory cell has been programmed within a desired Vt range to help prevent the memory cell from receiving further programming pulses, e.g., "over programming" the cell. For instance, memory cells to be programmed to the L1 target state can be program verified with a voltage PV1. Similarly, program verify voltage PV2 can be used with cells to be programmed to L2 and PV3 can be used with cells to be programmed to L3.

In the example illustrated in FIG. 2, voltage levels R1, R2, and R3 represent sensing voltages, e.g., read voltages, that can be used to distinguish between states L0, L1, L2, and L3 during a sensing operation. In a sensing operation performed on a selected memory cell in a NAND string, the unselected memory cells of the string can be biased with a pass voltage "Vpass" 229 so as to be in a conducting state. As illustrated in FIG. 2, Vpass 229 can have a greater magnitude than $Vt_{max}$. When all cells in a string are in a conductive state, current can flow between the source line contact at one end of the string and a drain line contact at the other end of the string. As such, the state of the selected cell can be determined based on the current and/or voltage sensed on a bit line corresponding to a particular string when the selected cell begins to conduct, e.g., in response to the particular read voltage applied to the control gate of the cell (via a selected word line). For example, the logical value of data stored in a selected cell can be determined based on whether the bit line current changes by a particular amount, or reaches a particular level within a given time period. Other types of sensing operations are also possible, as will be understood by one of ordinary skill in the art.

The Vt of a memory cell can change, e.g., shift, over time due to a number of mechanisms. For example, the charge storage node, e.g., floating gate, of the memory cell may lose charge over time. That is, charge may leak from the charge storage node. Such charge loss can cause the Vt of the cell to change, e.g., decrease. Additionally, as the memory cell undergoes programming and/or sensing operations over time, program disturb and/or read disturb mechanisms may cause the Vt of the cell to change, e.g., increase. Other mechanisms can also cause the Vt of the memory cell to change over time, as will be appreciated by one of ordinary skill in the art.

In some instances, such a Vt change can alter the state of the memory cell. For example, if the memory cell were programmed to target state L2, e.g., data 00, charge loss could cause the Vt of the memory cell to decrease to a level less than R2, or possibly to a level within Vt 225-1 corresponding to state L1, e.g., data 01.

Accordingly, such a Vt change can result in erroneous data being sensed during a sensing operation performed on the memory cell using the sensing voltages illustrated in FIG. 2, e.g., read voltages R1, R2 and R3, and/or program verify voltages PV1, PV2, and PV3. For example, performing a sensing operation using the sensing voltages illustrated in FIG. 2 may result in a determination that the memory cell represents a state other than the target state to which the cell was programmed. For instance, a sensing operation performed on a memory cell that was programmed to target state L2 and has undergone charge loss may determine that the cell represents state L1, if read voltage R2 is used in the sensing operation. That is, using read voltage R2 may result in a cell programmed to store data 00 being erroneously sensed as storing data 01.

As such, sensing voltages used during sensing operations performed before the Vt change occurs, e.g., the read and/or program verify voltages illustrated in FIG. 2, may no longer provide accurate and/or reliable sensing of memory cells that have undergone a Vt change, e.g., charge loss. However, adjusting, e.g., changing, the sensing voltages, e.g., to sensing voltages other than those illustrated in FIG. 2, may track and/or compensate for such a Vt change, thereby providing accurate and/or reliable sensing of the memory cells that have undergone the Vt change, as will be further described herein.

Figure 3:
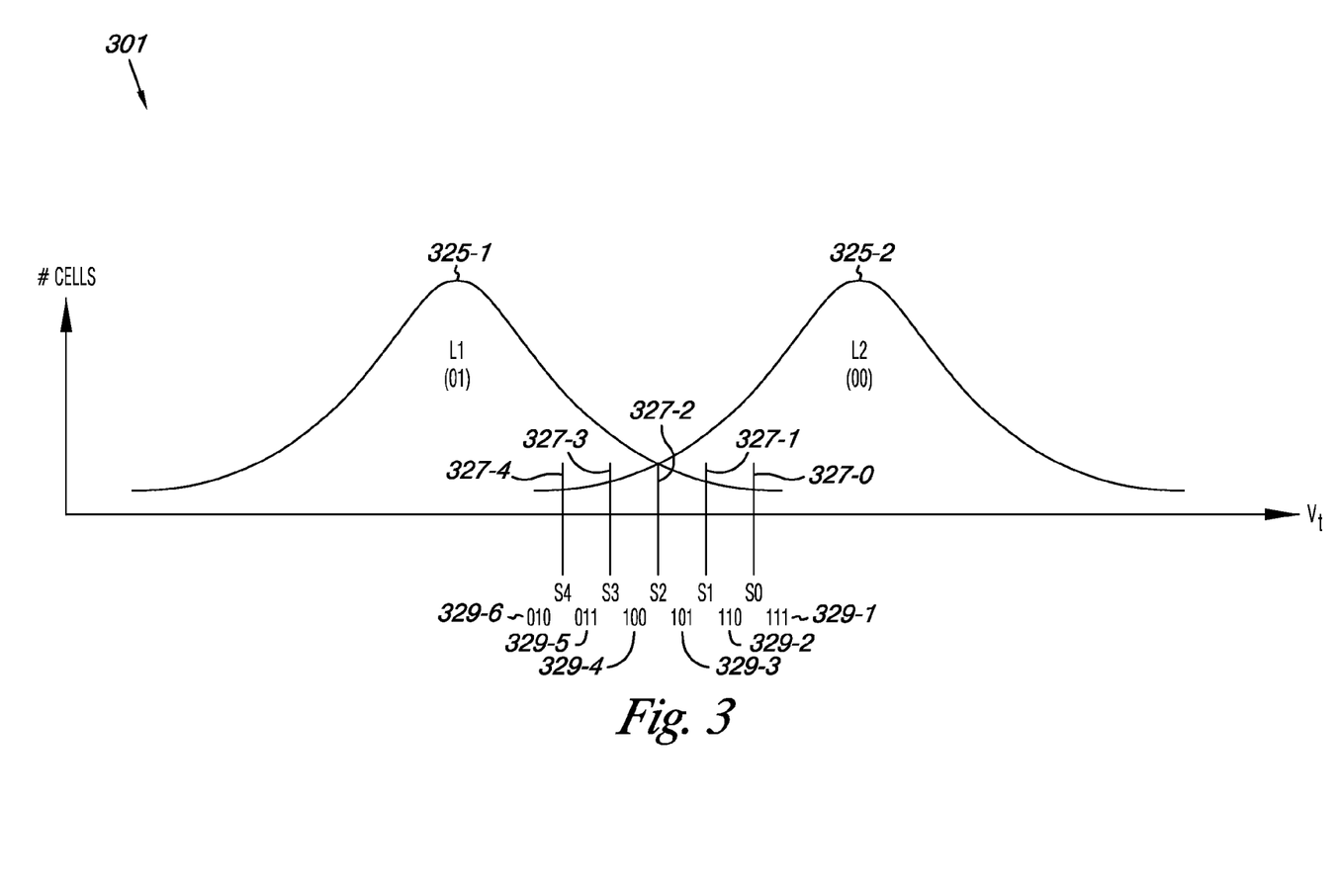
FIG. 3 illustrates a diagram of a number of threshold voltage distributions and sensing voltages in accordance with one or more embodiments of the present disclosure.

FIG. 3 illustrates a diagram 301 of threshold voltage (Vt) distributions 325-1 and 325-2, and sensing voltages S0, S1, S2, S3, and S4, in accordance with one or more embodiments of the present disclosure. The example shown in FIG. 3 can represent memory cells that have undergone a Vt change, e.g., shift, due to a mechanism such as charge loss, program disturb, and/or read disturb, for example. Vt distributions 325-1 and 325-2 can correspond to Vt distributions 225-1 and 225-2, respectively, previously described in connection with FIG. 2, after the memory cells represented by Vt distributions 225-1 and 225-2 have undergone a Vt change. Further, although not shown in FIG. 3 for simplicity, diagram 301 could also include additional Vt distributions corresponding to Vt distributions 225-0 and/or 225-3 previously described in connection with FIG. 2 after the memory cells represented by Vt distributions 225-0 and/or 225-3 have undergone a Vt change.

As shown in FIG. 3, Vt distributions 325-1 and 325-2 have shifted relative to Vt distributions 225-1 and 225-2 shown in FIG. 2, e.g., due to the Vt shifts of the memory cells represented therein. For example, portions of Vt distributions 325-1 and 325-2 overlap, as shown in FIG. 3. Accordingly, sensing voltages used before the Vt change occurred, e.g., the sensing voltages illustrated in FIG. 2, may no longer provide accurate and/or reliable sensing of the memory cells, as previously described herein. For instance, a memory cell programmed to target state L2 may be sensed as being in state L1.

However, adjusting the sensing voltages to different sensing voltages, e.g., to sensing voltages other than those illustrated in FIG. 2, can be used to track and/or compensate for the Vt change, thereby providing accurate and/or reliable sensing of the memory cells. For example, in the embodiment illustrated in FIG. 3, adjusting one or more of the sensing voltages to sensing voltage S2 may provide accurate and/or reliable sensing of the memory cells. That is, a sensing operation that uses sensing voltage S2 may sense less erroneous data than a sensing operation that uses the sensing voltages illustrated in FIG. 2. For example, sensing voltage S2 may be the sensing voltage that senses the least amount of erroneous data. The sensing voltage(s) that will provide accurate and/or reliable sensing of the memory cells, e.g., the sensing voltage that will sense the least amount of erroneous data, can be determined based, at least partially, on soft data associated with the memory cells. That is, the adjustment of the sensing voltages can be based, at least partially, on soft data associated with the memory cells, as will be further described herein.

As shown in FIG. 3, the memory cells represented by Vt distributions 325-1 and 325-2 have both hard and soft data associated therewith. The hard data is the data that corresponds to the state the memory cells are determined to be in by a sensing operation. For example, in the embodiment illustrated in FIG. 3, hard data 01 is associated with memory cells determined to be in state L1, and hard data 00 is associated with memory cells determined to be in state L2. The hard data may correspond to the target state to which the memory cells were programmed.

Soft data associated with a memory cell can indicate a location of the Vt of the memory cell within the Vt distribution representing the target state to which the memory cell was programmed. For example, in the embodiment illustrated in FIG. 3, soft data 111 indicates that the Vt of the memory cell is located at a voltage greater than sensing voltage S0 within the Vt distribution representing the target state to which the memory cell was programmed. That is, if the memory cell was programmed to target state L1, soft data 111 indicates that the Vt of the memory cell is located toward the edge of Vt distribution 325-1, and if the memory cell was programmed to target state L2, soft data 111 indicates that the Vt of the memory cell is located toward the middle of Vt distribution 325-2. Additionally, soft data 010 indicates that the Vt of the memory cell is located at a voltage less than sensing voltage S4, e.g., toward the middle of Vt distribution 325-1 if the memory cell was programmed to target state L1 and toward the edge of Vt distribution 325-2 if the memory cell was programmed to target state L2. Further, soft data 110 indicates that the Vt of the memory cell is located between sensing voltages S0 and S1, soft data 101 indicates that the Vt of the memory cell is located between sensing voltages S1 and S2, soft data 100 indicates that the Vt of the memory cell is located between sensing voltages S2 and S3, and soft data 011 indicates that the Vt of the memory cell is located between sensing voltages S3 and S4.

Soft data associated with a memory cell can also indicate a probability of whether the Vt of the memory cell corresponds to the target state to which the memory cell was programmed. For example, in the embodiment illustrated in FIG. 3, soft data 111 indicates a strong probability that the Vt of the memory cell corresponds to target state L2, soft data 110 indicates a moderate probability, e.g., a probability that is less than the strong probability, that the Vt of the memory cell corresponds to target state L2, and soft data 101 indicates a weak probability, e.g., a probability that is less than the moderate probability, that the Vt of the memory cell corresponds to target state L2. Additionally, soft data 010 indicates a strong probability that the Vt of the memory cell corresponds to target state L1, soft data 011 indicates a moderate probability that the Vt of the memory cell corresponds to target state L1, and soft data 100 indicates a weak probability that the Vt of the memory cell corresponds to target state L1.

Accordingly, not all memory cells associated with particular hard data may have the same soft data associated therewith. For example, a first memory cell associated with hard data 01 may have soft data 010 associated therewith, while a second memory cell associated with hard data 01 may have soft data 011 associated therewith. Further, not all memory cells associated with particular soft data may have the same hard data associated therewith. For example, a first memory cell associated with soft data 110 may have hard data 01 associated therewith, while a second memory cell associated with soft data 110 may have hard data 00 associated therewith.

Embodiments of the present disclosure are not limited to the sensing voltages and/or soft data regions shown in FIG. 3. For example, a greater number of sensing voltages and/or a greater amount of soft data regions can be used to indicate a more precise Vt location within a Vt distribution and/or a more precise probability of whether a Vt corresponds to a target state. However, for simplicity, five sensing voltages and six regions of soft data have been illustrated in FIG. 3. Additionally, although the sensing voltages are shown in FIG. 3 as being spaced apart by a particular, e.g., the same, voltage amount, embodiments of the present disclosure are not so limited, e.g., the sensing voltages can be spaced apart by different voltage amounts.

Figure 4:
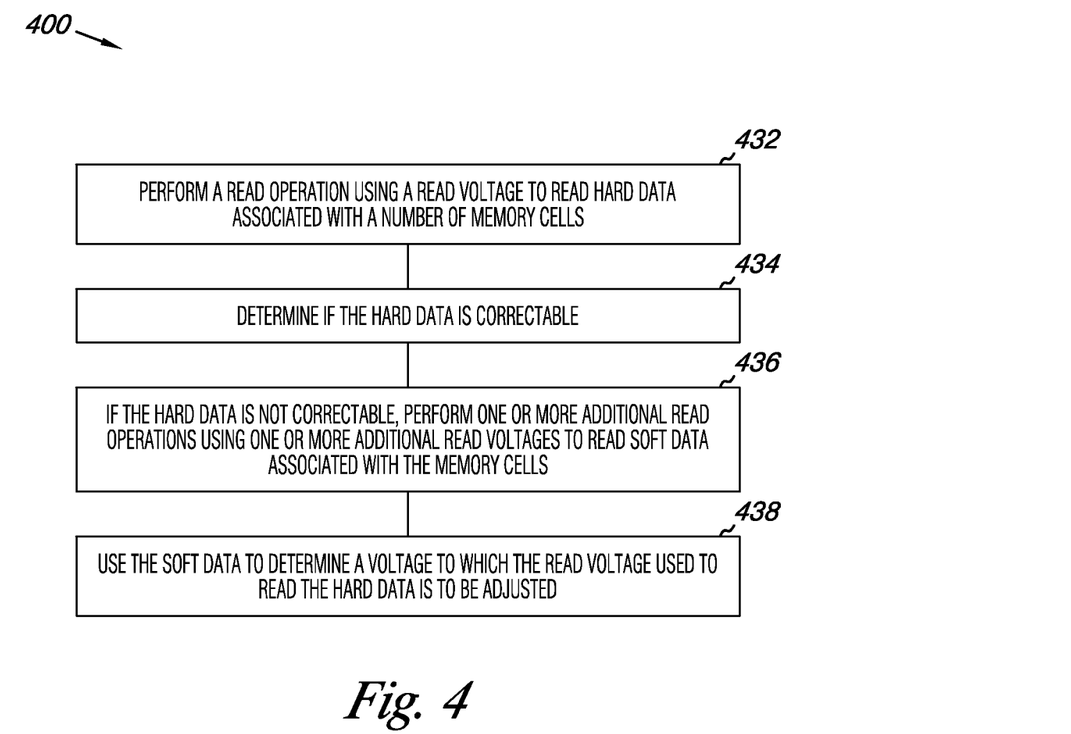
FIG. 4 is a flow chart illustrating a method for operating a memory device in accordance with one or more embodiments of the present disclosure.

FIG. 4 is a flow chart illustrating a method 400 for operating a memory device in accordance with one or more embodiments of the present disclosure. The memory device can be, for example, memory device 502 described in connection with FIG. 5. Additionally, the memory device can include one or more memory arrays, such as memory array 100 previously described in connection with FIG. 1.

At step 432, a sense, e.g., read, operation is performed using a sensing, e.g., read, voltage to sense, e.g., read, hard data associated with a number of memory cells. The read voltage can be, for example, read voltage R2 previously described in connection with FIG. 2. The memory cells can be, for example, memory cells 111-1, . . . , 111-N previously described in connection with FIG. 1. The hard data can be, for example, hard data analogous to the hard data previously described in connection with FIG. 3.

At step 434, a determination of whether the hard data is correctable is made. Determining whether the hard data is correctable can include, for example, performing an error correction operation on the hard data. If the error correction operation fails, the hard data may not be correctable.

If the hard data is not correctable, the memory cells may have undergone a threshold voltage (Vt) change, e.g., shift, as previously described herein. However, an adjustment, e.g., change, of the read voltage used to read the hard data to a different voltage can track and/or compensate for the Vt change, as previously described herein. This different voltage, e.g., the voltage to which the read voltage used to read the hard data is to be adjusted, can be determined using soft data.

For example, if the hard data is not correctable, one or more additional read operations are performed using one or more additional read voltages to read soft data associated with the memory cells at step 436. The additional read voltages can be, for example, sensing, e.g., read, voltages S0, S1, S2, S3, and/or S4 previously described in connection with FIG. 3, and the soft data can be, for example, soft data analogous to the soft data previously described in connection with FIG. 3. The soft data is used at step 438 to determine a voltage to which the read voltage used to read the hard data is to be adjusted. Examples of using soft data to determine the voltage to which the read voltage is to be adjusted will be further described in connection with FIG. 5.

Previous approaches may not use soft data to determine the voltage to which the read voltage used to read the hard data is to be adjusted. That is, previous approaches may not use soft data to track and/or compensate for a Vt change. For example, in previous approaches, if hard data is determined to be not correctable, a second read operation may be performed using a second read voltage to read hard data. If the hard data read using the second read voltage is determined to be correctable, the read voltage may be adjusted to the second read voltage. If the hard data read using the second read voltage is determined to be not correctable, a third read operation may be performed using a third read voltage to read hard data, and the process may be repeated until a read voltage that does not result in uncorrectable hard data being read is found, and the read voltage is adjusted to this voltage.

However, because soft data can indicate a location of a Vt within a Vt distribution and/or a probability of whether a Vt corresponds to a target state, as previously described herein, soft data can be used to track and/or compensate for a Vt change more accurately, reliably, and/or precisely than previous approaches that do not use soft data. For example, more bits of hard data read during a read operation may be correctable if the hard data is read using an adjusted read voltage that has been adjusted based on soft data than if the hard data is read using an adjusted read voltage that has been adjusted using previous approaches. Additionally, hard data read using an adjusted read voltage that has been adjusted based on soft data may be correctable for a longer period of time, e.g., a greater number of program and erase cycles, than hard data read using an adjusted read voltage that has been adjusted using previous approaches. That is, a longer period of time, e.g., a greater number of program and erase cycles, may pass until the adjusted voltage needs to be adjusted again due to an additional Vt shift if the adjusted read voltage has been adjusted based on soft data than if the adjusted read voltage has been adjusted using previous approaches.

Figure 5:
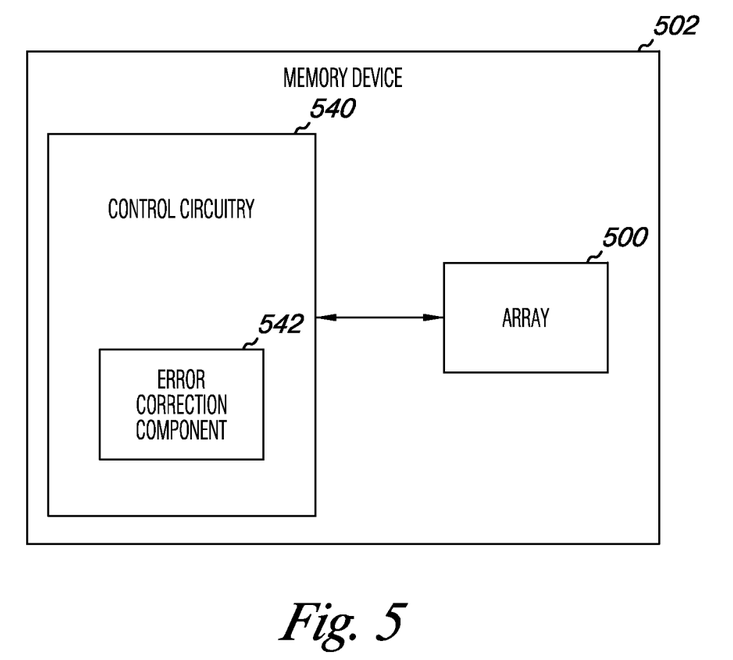
FIG. 5 illustrates a block diagram of a memory device in accordance with one or more embodiments of the present disclosure.

FIG. 5 illustrates a block diagram of a memory device 502 in accordance with one or more embodiments of the present disclosure. As shown in FIG. 5, memory device 502 includes memory array 500. Memory array 500 can be, for example, memory array 100 previously described in connection with FIG. 1. Although one memory array is shown in FIG. 5, embodiments of the present disclosure are not so limited, e.g., memory device 502 can include more than one memory array.

Memory device 502 also includes control circuitry 540 coupled to memory array 500, as shown in FIG. 5. Control circuitry 540 includes an error correction component 542. Error correction component 542 can be, for example, an error correction code decoder. However, embodiments are not limited to a particular type of error correction component.

Control circuitry 540 can be configured to track and/or compensate for a threshold voltage (Vt) change, e.g., shift, in the memory cells in memory array 500 by adjusting a sensing voltage, e.g., a read voltage, used to determine a target state of the memory cells. The adjustment of the sensing voltage can be based, at least partially, on soft data associated with the target state. That is, soft data associated with the target state can be used to determine the voltage to which the sensing voltage is to be adjusted.

For example, control circuitry 540 can be configured to perform a number of sense operations on the memory cells in memory array 500 using a number of sensing voltages to determine soft data associated with a target state of the memory cells. Each sense operation can be performed using a different sensing voltage. Control circuitry 540 can be configured to adjust a sensing voltage used to determine the target state based, at least partially, on the determined soft data.

The number of sensing voltages used to determine the soft data can be, for example, sensing voltages S0, S1, S2, S3, and/or S4 previously described in connection with FIG. 3. The soft data can be, for example, the soft data previously described in connection with FIG. 3. The target state can be, for example, target state L1 or target state L2 previously described in connection with FIGS. 2 and 3. The sensing voltage to be adjusted can be, for example, read voltage R2 previously described in connection with FIG. 2. However, embodiments are not limited to particular sensing voltages, soft data, or target states.

Control circuitry 540 can be configured to determine a state of the memory cells in memory array 500 using the adjusted sensing voltage. For example, control circuitry 540 can be configured to perform a sense operation on the memory cells in memory array 500 using the adjusted sensing voltage to sense the state of the memory cells.

Control circuitry 540 can be configured to store the determined soft data. For example, control circuitry 540 can include memory, e.g., DRAM or SDRAM, (not shown in FIG. 5) that stores the determined soft data. The memory can be used exclusively to store soft data, or the memory can store additional data along with soft data. The memory can include, for example, at least four pages of memory cells to store the determined soft data. Further, the amount of memory used to store the soft data may depend on the number of sense operations performed to determine the soft data. For example, the number of bits used to store the determined soft data can be given by:

$$\log_2(X+1)$$

where X is the number of sense operations performed to determine the soft data. Subsequent, e.g., future, adjustments of the sensing voltage used to determine the target state can be adjusted based, at least partially, on the stored soft data. That is, the sensing voltage used to determine the target state can be adjusted based, at least partially, on previously determined soft data that is stored in control circuitry 540.

Control circuitry 540 can be configured to perform, e.g., automatically, the number of sense operations to determine the soft data in response to a failure of an error correction operation performed by error correction component 542 on data associated with a determined, e.g., sensed, state of the memory cells in memory array 500. The failure of the error correction operation may be caused by, for example, a Vt shift of the memory cells in memory array 500, as previously described herein. Control circuitry 540 can also be configured to perform the number of sense operations to determine the soft data prior to a failure of such an error correction operation. The soft data determined by the sense operations performed prior to the error correction operation failure can be stored by control circuitry 540, as previously described herein. In response to a subsequent error correction operation failure, control circuitry 540 can be configured to adjust the sensing voltage used to determine the target state based, at least partially, on the stored soft data. That is, the sensing voltage used to determine the target state can be adjusted based, at least partially, on soft data determined prior to the error correction operation and stored in control circuitry 540.

The number of sensing voltages used to determine the soft data can be spaced apart by a particular, e.g., the same, voltage amount. Alternatively, the number of sensing voltages used to determine the soft data can be spaced apart by different voltage amounts. The voltage spacing between the sensing voltages can affect the precision of the determined soft data. For example, the less voltage spacing between the sensing voltages, the greater the precision of the determined soft data.

The number of sense operations performed to determine the soft data and/or the number of sensing voltages used to determine the soft data can be, for example, at least four. In such embodiments, the soft data, e.g., each region of soft data, can include at least two bits of data. Additionally, the number of sense operations performed to determine the soft data and/or the number of sensing voltages used to determine the soft data can be, for example, at least eight. In such embodiments, the soft data, e.g., each region of soft data, can include at least three bits of data. However, embodiments of the present disclosure are not limited to a particular number of sense operations or sensing voltages.

In one or more embodiments, error correction component 542 can be configured to perform an error correction operation on the soft data determined by the number of sense operations. For example, error correction component 542 can be configured to run an error correction algorithm, such as a low-density parity-check (LDPC), trellis coded modulation (TCM), or soft Reed-Solomon (RS) algorithm, on the soft data. However, embodiments are not limited to a particular type of error correction algorithm.

Control circuitry 540 can be configured to adjust the sensing voltage used to determine the target state of the memory cells in memory array 500 based, at least partially, on a result of the error correction operation performed on the soft data. That is, control circuitry 540 can be configured to use the soft data to determine the voltage to which the sensing voltage is to be adjusted. For example, the error correction operation can determine which sense operation has the lowest amount of errors associated therewith, and control circuitry 540 can adjust the sensing voltage used to determine the target state of the memory cells to the sensing voltage used to perform the sense operation determined to have the lowest amount of errors associated therewith.

In one or more embodiments, control circuitry 540 can be configured to perform a first sense operation on the memory cells in memory array 500 using a first sensing voltage to determine soft data associated with the target state of the memory cells. Error correction component 542 can perform an error correction operation on the determined soft data. If the error correction operation does not result in a failure, control circuitry 540 can be configured to adjust the sensing voltage used to determine the target state to the first sensing voltage. If the error correction operation results in a failure, control circuitry 540 can be configured to perform a second sense operation on the memory cells using a second sensing voltage, e.g., a sensing voltage different than the first sensing voltage, to determine additional soft data associated with the target state of the memory cells. Error correction component 542 can perform an additional error correction operation on the determined additional soft data. If the additional error correction operation does not result in a failure, control circuitry 540 can be configured to adjust the sensing voltage used to determine the target state to the second sensing voltage. If the additional error correction operation results in a failure, control circuitry 540 can be configured to repeat this process using additional sensing voltages until an error correction operation does not result in a failure, and the sensing voltage used to determine the target state is adjusted accordingly.

The second sensing voltage can be a lower voltage than the first sensing voltage. Using a lower voltage as the second sensing voltage can track and/or compensate for a Vt change in the memory cells in memory array 500 due to charge loss, for example. Alternatively, the second sensing voltage can be a higher voltage than the first sensing voltage. Using a higher voltage as the second sensing voltage can track and/or compensate for a Vt change in the memory cells due to a read disturb and/or a program disturb mechanism.

The embodiment illustrated in FIG. 5 can include additional circuitry that is not illustrated so as not to obscure embodiments of the present disclosure. For example, memory device 502 can include address circuitry to latch address signals provided over I/O connectors through I/O circuitry. Address signals can be received and decoded by a row decoder and a column decoder, to access memory array 500. It will be appreciated by those skilled in the art that the number of address input connectors can depend on the density and architecture of memory device 502 and/or memory array 500.

CONCLUSION

The present disclosure includes methods, devices, and systems for determining and using soft data in memory devices and systems. One or more embodiments include an array of memory cells and control circuitry coupled to the array. The control circuitry is configured to perform a number of sense operations on the memory cells using a number of sensing voltages to determine soft data associated with a target state of the memory cells, and adjust a sensing voltage used to determine the target state based, at least partially, on the determined soft data.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:
1. A memory device, comprising:
an array of memory cells; and
control circuitry coupled to the array and configured to:
perform a number of sense operations on the memory cells using a number of sensing voltages to determine soft data associated with a target state of the memory cells; and adjust a sensing voltage used to determine the target state based, at least partially, on the determined soft data.

2. The memory device of claim 1, wherein the determined soft data indicates a location of a number of threshold voltages associated with the memory cells within a threshold voltage distribution associated with the target state.

3. The memory device of claim 1, wherein the control circuitry is configured to:
perform a first sense operation on the memory cells using a first sensing voltage to determine soft data associated with the target state of the memory cells; and
adjust the sensing voltage used to determine the target state to the first sensing voltage if an error correction operation performed on the determined soft data does not result in a failure.

4. The memory device of claim 3, wherein the control circuitry is configured to:
perform a second sense operation on the memory cells using a second sensing voltage to determine additional soft data associated with the target state of the memory cells if the error correction operation performed on the determined soft data results in a failure; and
adjust the sensing voltage used to determine the target state to the second sensing voltage if an error correction operation performed on the determined additional soft data does not result in a failure.

5. The memory device of claim 1, wherein the control circuitry is configured to store the determined soft data.

6. A method for operating a memory device, comprising:
determining soft data associated with a target state of a number of memory cells by performing a number of sense operations on the memory cells, wherein each sense operation is performed using a different sensing voltage; and
adjusting a sensing voltage used to determine the target state based, at least partially, on the determined soft data.

7. The method of claim 6, wherein the determined soft data indicates a probability of whether a number of threshold voltages associated with the memory cells correspond to the target state.

8. The method of claim 7, wherein the determined soft data indicates a strong, a moderate, and/or a weak probability of whether the threshold voltages associated with the memory cells correspond to the target state.

9. The method of claim 6, wherein the method includes:
performing an error correction operation on the determined soft data; and
adjusting the sensing voltage used to determine the target state based, at least partially, on a result of the error correction operation.

10. The method of claim 6, wherein the method includes determining a state of the memory cells using the adjusted sensing voltage.

11. The method of claim 6, wherein the method includes:
determining the soft data by performing the sense operations prior to a failure of an error correction operation performed on data associated with a determined state of the memory cells; and
in response to the failure of the error correction operation, adjusting the sensing voltage used to determine the target state based, at least partially, on the determined soft data.

12. The method of claim 6, wherein the method includes performing the number of sense operations on the memory cells in response to a failure of an error correction operation performed on data associated with a determined state of the memory cells.

* * * * *